United States Patent [19]

Bauer et al.

[11] Patent Number: 5,351,003
[45] Date of Patent: Sep. 27, 1994

[54] TEMPERATURE COMPENSATED MAGNETORESISTIVE POSITION SENSOR

[75] Inventors: Harry J. Bauer, Troy; Ronald T. Golebiewski, Romeo, both of Mich.

[73] Assignee: General Motors Corporation, Detroit, Mich.

[21] Appl. No.: 42,228

[22] Filed: Apr. 2, 1993

[51] Int. Cl.$^5$ .................. G01B 7/14; G01R 33/06; G01D 5/18
[52] U.S. Cl. ................... 324/207.12; 307/309; 324/207.21; 324/207.24
[58] Field of Search .............. 324/207.12, 207.21, 324/207.24, 252; 307/309; 338/32 R

[56] References Cited

U.S. PATENT DOCUMENTS

| | | | |
|---|---|---|---|
| 3,934,160 | 1/1976 | Van Borcke | 307/309 |
| 4,480,248 | 10/1984 | Sudo et al. | 338/32 |
| 4,924,696 | 5/1990 | Schroeder et al. | 73/118.1 |
| 5,142,225 | 8/1992 | Gerlach et al. | 324/207.21 |

*Primary Examiner*—Gerard R. Strecker
*Attorney, Agent, or Firm*—Jimmy L. Funke

[57] ABSTRACT

A temperature compensated magnetoresistive position sensor is disclosed. The sensor includes two magnetoresistor (MR) elements biased with magnetic flux from a permanent magnet, and connected electrically in series with a precision resistor and a voltage source. A magnetically permeable slide bar is movable to positions within a defined range adjacent to the sensor for varying the magnetic flux and changing the resistance of each MR element, while maintaining the sum of the resistances of the MR elements essentially constant. For a given slide bar position, the voltage drops appearing across the precision resistor and the MR elements are processed by a computer to determine the value for a resistance ratio, where the resistance ratio equals the resistance of one of the MR elements divided by the sum of the resistances of both MR elements at the sensor operating temperature. The determined value for the resistance ratio is transformed based upon the sum of the MR element resistances to obtain a compensated resistance ratio value that would occur for the same slide bar position at room temperature. The compensated resistance ratio value is then used in conjunction with the known behavior of the sensor at room temperature to provide an accurate indication of the slide bar position that is essentially unaffected by the influenced of sensor operating temperature. A correction term can also be added to the compensated resistance ratio value to account for any mechanical offset associated with sensor component tolerances.

6 Claims, 5 Drawing Sheets

TEMPERATURE COMPENSATED MAGNETORESISTIVE POSITION SENSOR

BACKGROUND OF THE INVENTION

This invention relates generally to magnetoresistive displacement or position measuring sensors, and more particularly, to a magnetoresistive sensor which is compensated to substantially reduce the influence of temperature variations on the accuracy of position measurements.

The use of magnetoresistor (MR) elements for sensing the position or displacement of a magnetically permeable member has been known for several years, see for example, U.S. Pat. No. 3,934,160 issued to Von Borcke in 1976. Such sensors typically include a pair of series connected MR elements forming a voltage divider, a permanent magnet for passing a magnetic flux through the MR elements, and a magnetically permeable member that moves proximate and relative to the MR elements to vary the amount of magnetic flux passing through the MR elements. The magnetically permeable member is generally configured to increase the magnetic flux passing through one MR element while decreasing the amount of flux passing through the other MR element as the member moves in one direction, and conversely when the member is moved in the opposite direction. As a consequence, the magnitude of the voltage appearing across the MR voltage divider provides an indication of the relative position of the magnetically permeable member, since the resistance of each MR element depends directly upon the amount of magnetic flux passing therethrough.

A principle problem associated with the above described type of magnetoresistive position sensors is their sensitivity to changes in operating temperature and the resulting decrease in measurement accuracy. Temperature compensation of such sensors is quite difficult because the temperature coefficient of resistance for the MR elements depends upon the strength of the magnetic field passing through the elements which varies with the position of the magnetically permeable member being measured.

The conventional approach for temperature compensating magnetoresistive position sensors has been to physically mount the two series connected magnetoresistors with two series connected thermistors in a bridge configuration within the same electronic package so the voltage exciting the MRs is adjusted with changing temperature. This traditional approach has several disadvantages. First, the temperature coefficients of resistance for the magnetoresistive elements and the thermistors can only be approximately matched in practice. Second, the physical interfacing of the thermistor and the MR circuitry prevents the thermistors and MRs from being at exactly the same temperature. Third, the mounting of thermistors adjacent to the MRs increase packaging size, cost, and number of required package interconnections.

SUMMARY OF THE INVENTION

The present invention is directed toward providing a temperature compensated magnetoresistive position sensor that can provide accurate position measurements at different sensor operating temperatures without requiring thermistors packaged with the magnetoresistor elements.

Another objective of the present invention is to provide magnetoresistive position sensor that can be easily corrected to account for any mechanical offset associated with sensor component tolerances.

Broadly, these and other objects of the invention are accomplished by providing a magnetoresistive position sensor which includes two series connected magnetoresistor (MR) elements that are electrically excited to cause a current flow therethrough, and magnetically biased with magnetic flux passing through the MR elements. A magnetically permeable member movable to positions within a defined range relative to the MR elements is provided for varying the magnetic flux and changing the resistance of each MR element, while maintaining the sum of the MR element resistances essentially constant. For a given position of the magnetically permeable member and sensor operating temperature, the individual resistances of the MR elements and their sum are determined based upon the current flowing through the MR elements. A value for a resistance ratio is determined, where the resistance ratio equals the resistance of one of the MR elements divided by the total resistance of both MR elements. The value for the resistance ratio is transformed based upon the total resistance of the MR elements to obtain a compensated resistance ratio value that would occur for the same position of the magnetically permeable member at room temperature. The compensated resistance ratio value is then used in conjunction with the known behavior of the sensor at room temperature to provide an accurate indication of the position of the magnetically permeable member that is essentially independent of sensor operating temperature.

The compensated value for the resistance ratio can also be easily corrected to account for sensor mechanical offset, which represents an amount by which a defined zero location for the magnetically permeably member differs from a location causing the resistances of the MR elements to be essentially equal. This is accomplished by adding a correction term to the compensated resistance ratio value prior to determining the position of the magnetically permeable member. The correction term is computed by subtracting a value determined for the resistance ratio with the magnetically permeably member located at the defined zero location from a value of 0.5.

In the preferred embodiment of the invention, a voltage source is connected across a series combination comprising a precision resistor and the series connected MR elements to induce the current flow through the series combination. Since the resistances of the MR elements are determined based upon this current, which is itself determined by the voltage drop appearing across the precision resistor, the present invention does not require the use of an expensive regulated voltage source for providing electrical excitation, which is generally the case for conventional magnetoresistive position sensors.

These and other aspects and advantages of the invention may be best understood by reference to the following detailed description of a preferred embodiment when considered in conjunction with the accompanying drawings.

DESCRIPTION OF THE PREFERRED EMBODIMENT

Figure 1:
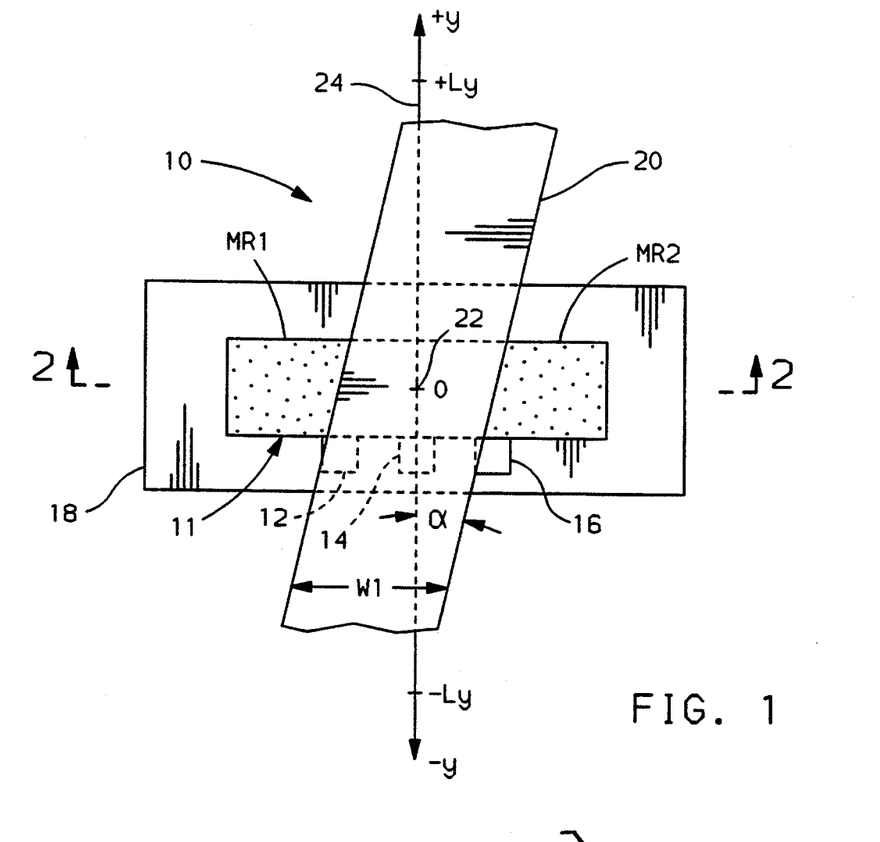
FIG. 1 illustrates the components of a magnetoresistive position sensor that operates in accordance with the principles of the present invention.

Referring now to FIG. 1, there is illustrated a magnetoresistive position sensor, generally designated by the numeral 10, which is operated in accordance with the principles of the present invention. The magnetoresistive sensor 10 includes a dual magnetoresistor (MR) element device 11, a permanent magnet 18, and movable magnetically permeable member 20.

The dual MR element device 11, contains two series connected magnetoresistors designated as MR1 and MR2 that are packaged as a single unit with output terminals 12, 14, and 16. The terminal 14 is connected to the electrical junction formed between MR1 and MR2, while terminals 12 and 16 are respectively connected to the opposite non-junction ends of MR1 and MR2. In the presently described embodiment of the invention, the magnetoresistors MR1 and MR2 are assumed to have approximately the same surface areas in the plane of FIG. 1, and hence, the same resistances. Dual MR element devices 11 having these characteristics are well known in the art and are typically fabricated using InSb/NiSb semiconductor magnetoresistive material deposited on a substrate. Packaged versions of such dual MR element devices 11 are commercially available, as for example, the Differential Magnetoresistor FP 414 L 300 manufactured by the Siemens Corporation.

As shown, the dual MR element device 11 is magnetically biased by the permanent magnetic 18, but alternatively, an electromagnet could be used to perform this function. The dual MR element device 11 is positioned on the north (N) pole of permanent magnet 18, such that magnetic flux (not shown) passes from the north pole, and through the MR elements before returning to the south (S) magnetic pole (see FIG. 2).

For the purpose of explaining the present invention, the magnetically permeable member 20 takes the form of a steel slide bar positioned adjacent to the dual element MR device 11 and movable through the magnetic flux passing through the magnetoresistor elements MR1 and MR2. As depicted in FIG. 1, the slide bar 20 has a width of W1 and is rotated at a constant angle $\alpha$ with respect to a transverse y-axis 24 dividing the dual MR element device 11 into essentially equal portions forming the magnetoresistor elements MR1 and MR2. The center point 22 of the slide bar 20 moves relative to the dual MR element device 11 in the indicated +y and −y directions along the y-axis 24. In use, the slide bar 20 is typically fixed rigidly to some movable component (not shown), the position of which is to be determined based upon the location of the center point 22 of the slide bar 20 along the y-axis 24.

Figure 2:
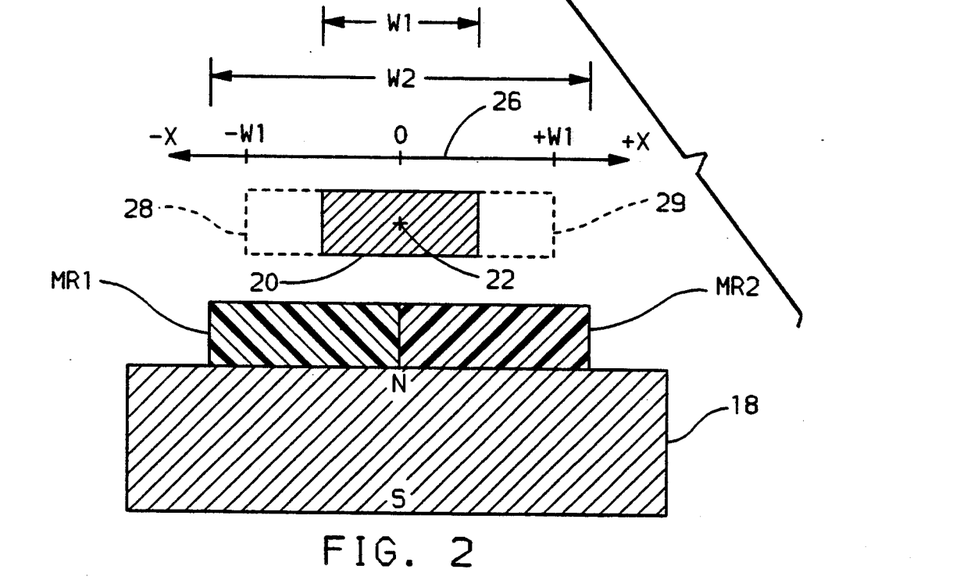
FIG. 2 illustrates a sectional view of the magnetoresistive position sensor along the section line 2—2 in FIG. 1.

Referring now to FIG. 2, there is shown a sectional view of the magnetoresistive position sensor 10 in a longitudinal direction along section line 2—2 in FIG. 1. It will be understood that when the center point 22 of the slide bar 20 is at the zero position on the y-axis 24, equal portions of the slide bar 20 cover the magnetoresistor elements MR1 and MR2. When the center point 22 of the slide bar 20 is moved to the −Ly position on the y-axis 24, the right edge 29 of the slide bar 20 (shown in dotted line form) moves to a position +W1 indicated on an x-axis 26 provided in FIG. 2, with the slide bar 20 essentially covering only the magnetoresistor MR2 (assuming small angles of $\alpha$). Likewise, when the center point 22 of the slide bar 20 moves to the +Ly position on the y-axis 24, the left edge 28 of slide bar 20 (also shown in dotted line form) moves to the position −W1 on the x-axis 26, with slide bar 20 now essentially covering only the magnetoresistor MR1.

As is well known, the amount of magnetic flux passing through the magnetoresistors MR1 and MR2, and their respective resistances, increase and decrease as the portion of the magnetically permeable slide bar 20 (projected area) covering each magnetoresistor increases and decreases. Consequently, MR1 and MR2 have approximately equal resistances when the center point 22 of the slide bar 20 is positioned at the zero location on the y-axis. As the center point 22 of the slide bar 20 moves from zero to +Ly on the y-axis, the resistance of MR1 increases to a maximum value, while the resistance of MR2 decreases to a minimum value. Likewise, when the slide bar center point 22 moves from zero to −Ly on the y-axis, the resistance of MR2 increases to a maximum, while the resistance of MR1 decreases to a minimum.

As long as the portions of the projected area of the slide bar 20 covering both magnetoresistors MR1 and MR2 remains approximately constant over the defined range of movement for the slide bar 20 between −Ly and +Ly, the applicants have found that the bulk or total resistance MRT of the two magnetoresistors remains approximately constant, i.e., MRT=MR1+MR2 remains essentially constant since increases and decreases in the resistance of MR1 due to the movement of slide bar 20 are approximately offset by a correspondingly equal decreases and increases in the resistance of MR2. This of course presumes that the cross-sectional area of the slide bar moving to covering MR1 and/or MR2 remains essentially unchanged.

In general, the width W1 of slide bar 20 can be less than one-half of the width W2 of the dual MR element device 11 in the longitudinal direction along the sectional line 2—2 in FIG. 1. However, it will be recognized that the maximum resistance values for MR1 and MR2 occur when the slide bar width W1 is essentially equal to one-half of the dual MR element device width W2, so that the surface area of each of MR1 and MR2 is completely covered by the slide bar 20 when the center point 22 is respectively positioned at $+Ly$ and at $-Ly$.

Those skilled in the art will also recognize that alternative magnetically permeable members can be used to replace slide bar 20 in the above described magnetoresistive position sensor 10, while still providing a relatively constant bulk or total resistance MRT for the dual MR element device over the range of member movement. For example, instead of being moved along the y-axis, a relatively smaller magnetically permeable member can be moved in the longitudinal direction along section line 2—2 to cover and uncover portions of MR1 and MR2.

Figure 3:
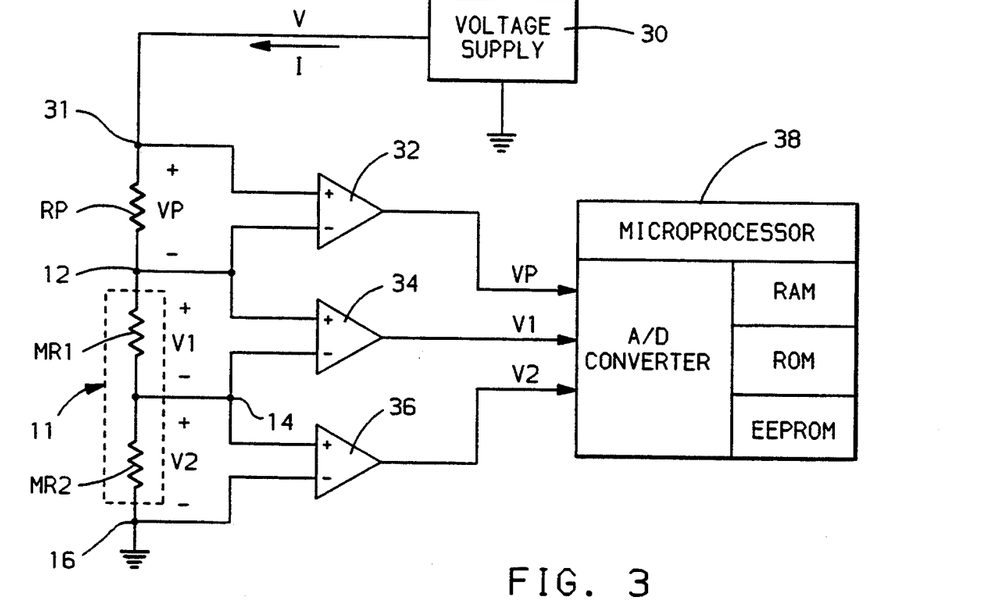
FIG. 3 illustrates a block diagram of the electronic circuitry used for obtaining electrical signals from the magnetoresistive position sensor and for compensating for temperature variations in accordance with the principles of the present invention.

Referring now to FIG. 3, there is shown a block diagram of electronic circuitry used for obtaining electrical signals related to the position of the slide bar 20 relative to the dual MR element device 11 and for compensating for temperature variations in accordance with the principles of the present invention. This circuitry includes a standard voltage supply 30; a precision resistor RP; three differential amplifiers 32, 34, and 36; and a computer 38. It will be recognized that junctions 12, 14, and 16 in FIG. 3 represent the output terminals 12, 14, and 16 of the dual MR element device 11 containing MR1 and MR2.

Output terminal 16 of the dual MR element device 11 is connected to electrical ground, while output terminal 12 is connected to one end of the precision resistor RP. The opposite end of precision resistor RP is connected to the output of the voltage supply 30 at junction 31.

The voltage supply 30 provides a voltage potential of V volts at junction 31 with respect to ground potential at junction 16, thereby inducing a current I to flow through the series connected resistor combination including precision resistor RP, magnetoresistor MR1, and magnetoresistor MR2. In the present embodiment of the invention, the value of the current I is determined based upon the voltage drop VP appearing across the precision resistor RP. Consequently, the temperature coefficient of resistance for the precision resistor RP should be relatively smaller (say an order of magnitude) compared to that of the magnetoresistors MR1 and MR2, which is in the order of $-0.5\%$ per °C. over an operating temperature range extending from $-40°$ to $130°$ C. Precision resistors acceptable for this usage are readily available from a variety of commercial sources.

Difference amplifiers 32, 34, and 36 serve as buffer amplifiers for respectively monitoring the voltage drops VP, V1, and V2 induced across the corresponding precision resistor RP, magnetoresistor MR1, and magnetoresistor MR2 by the series current flow I. Well known operational amplifier circuits can be used for implementing the difference amplifiers 32, 34, and 36, and for simplicity each difference amplifier is shown as having unity gain, but could provide amplification if desirable.

The outputs voltages VP, V1, and V2 from the difference amplifiers 32, 34, and 36 are directed to an analog-to-digital converter contained within the computer 38. In addition to the analog-to-digital converter, computer 38 includes other standard components such as a microprocessor, random access memory (RAM) for storing data, read only memory (ROM) for storing operating programs, and electrically erasable programmable read only memory (EEPROM) for the long term storage of calibration values and data tables. In practice, computer 38 would typically be programmed to perform some type of control or monitoring function with the magnetoresistive position sensor 10 serving as one of possibly many input transducers.

Figure 4:
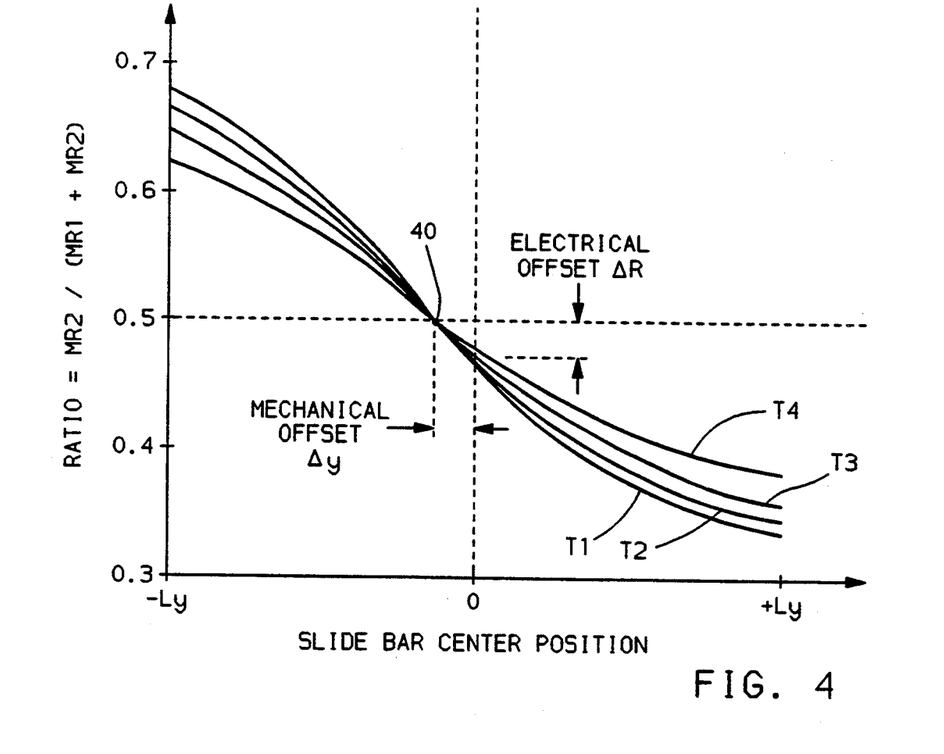
FIG. 4 illustrates a family of curves representing values for a resistance RATIO associated with the magnetoresistive position sensor versus the position of the slide bar for different sensor operating temperatures.

Referring now to FIG. 4, there is presented a family of curves representing values for a resistance RATIO=MR2/(MR1+MR2) for the dual MR element device 11 versus the position of the slide bar center point 22 within its defined range of movement between $-Ly$ and $+Ly$ on the y-axis 24. It will be recognized that this resistance RATIO represents the normalized voltage output V2/(V1+V2) produced by the voltage divider formed by MR1 and MR2. As will be shown, the values for the resistance RATIO can be determined by computer 38 based upon the known resistance value of RP, and the measured values of the voltages VP, V1, and V2 provided to computer 38.

The single curve labeled T1 in FIG. 4 illustrates the variation in the value of the resistance RATIO as a function of changing slide bar 20 position for operating temperatures of $-40°$, $-20°$, and $0°$ C., while the separate curves labeled T2, T3, and T4 represent the variations of RATIO for the respective sensor operating temperatures of $20°$, $80°$, and $130°$ C. The differences between the RATIO curves result from the temperature dependence of the resistances of the magnetoresistors MR1 and MR2, i.e., the temperature coefficient of resistance for the magnetoresistors, which also varies depending upon the strength of the magnetic field passing through the magnetoresistors.

The applicants have recognized that independent of the operating temperature, all of the RATIO curves pass through the same point 40, which is defined as the magnetic center of the magnetoresistive position sensor 10, i.e., the slide bar position where the MR1 and MR2 have equal resistances, thereby making the resistance RATIO $=0.5$. Additionally, the applicants have experimentally determined that the slopes of any two resistance RATIO curves at corresponding slide bar positions differ by a constant multiplicative factor that depends upon the operating temperature difference between the two resistance RATIO curves. As will be described subsequently, these realizations formed the basis for compensating the magnetoresistive position sensor to essentially remove the influence of operating temperature on the accuracy of position measurements provided by the magnetoresistive position sensor 10.

It is also generally desirable that the magnetic center point 40 for a particular magnetoresistive position sensor 10 be aligned with the zero position of the slide bar center. However, as indicated in FIG. 4, this is usually not the case due to a sensor mechanical offset designated as $\Delta y$. The amount of mechanical offset $\Delta y$ typically varies for different sensors due to factors such as variations in the magnetic field strength of the permanent magnet 18, mounting and matching tolerances for the magnetoresistors MR1 and MR2, and tolerances associated with the slide bar 20 and other magnetic components that may be affiliated with the magnetoresistive position sensor 10. Also indicated in FIG. 4 is an electrical offset $\Delta R$ associated with the mechanical offset $\Delta y$. The electrical offset $\Delta R$ is defined to equal to 0.5 minus the value for the resistance RATIO when the slide bar center is positioned at zero and the operating temperature is approximately $20°$ C. (room temperature). As will be described, the present invention provides a simple technique to account for the mechanical and electrical offsets associated with the magnetoresistive position sensor 10.

Figure 5:
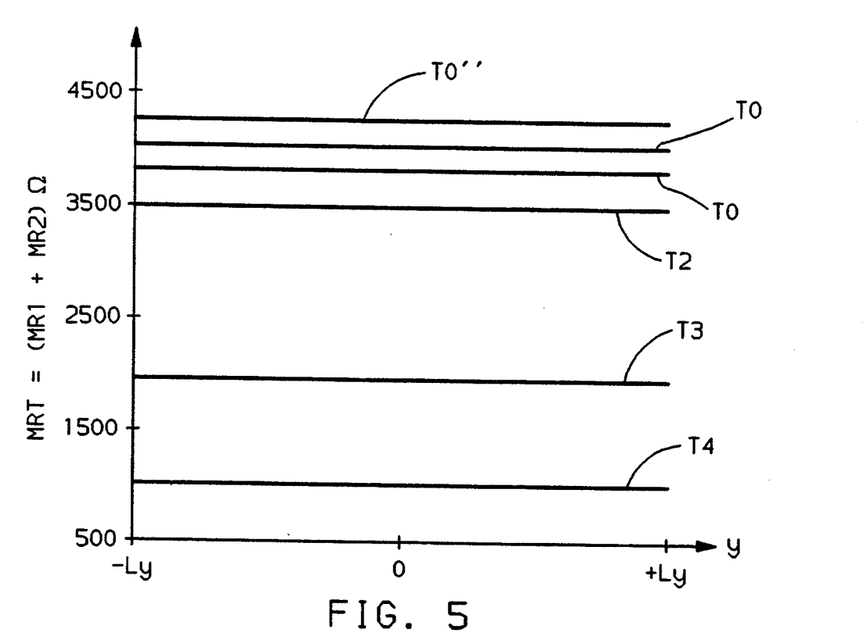
FIG. 5 illustrates the relationship between the bulk or total resistance of the magnetoresistors of the position sensor and the sensor operating temperature.

As described previously, a range of movement for the slide bar 20, or any other alternative magnetically permeable member, can be defined to vary the resistances of MR1 and MR2, while maintaining the bulk or total resistance MRT of the dual MR element device 11 essentially constant. This being the case, the applicants have found that the operating temperature of the magnetoresistors MR1 and MR2 can be determined by the value of bulk resistance MRT, independent of the position of slide bar 20. This relationship between the operating temperature of MR1 and MR2 and the bulk resistance MRT is illustrated by the experimentally obtained curves presented in FIG. 5. Here, the curves labeled as T2, T3, and T4 correspond respectively to sensor operating temperatures of 20°, 80° and 130° C., while the curves labeled as T0, T0', and T0" correspond to sensor operating temperatures of 0°, −20°, and −40° C., respectively. From these curves, it will be understood that the MR operating temperature is inversely related to the value of the bulk magnetoresistance MRT, and thus, the operating temperature of the magnetoresistors MR1 and MR2 can determined directly from the value of the bulk resistance MRT.

Figure 6:
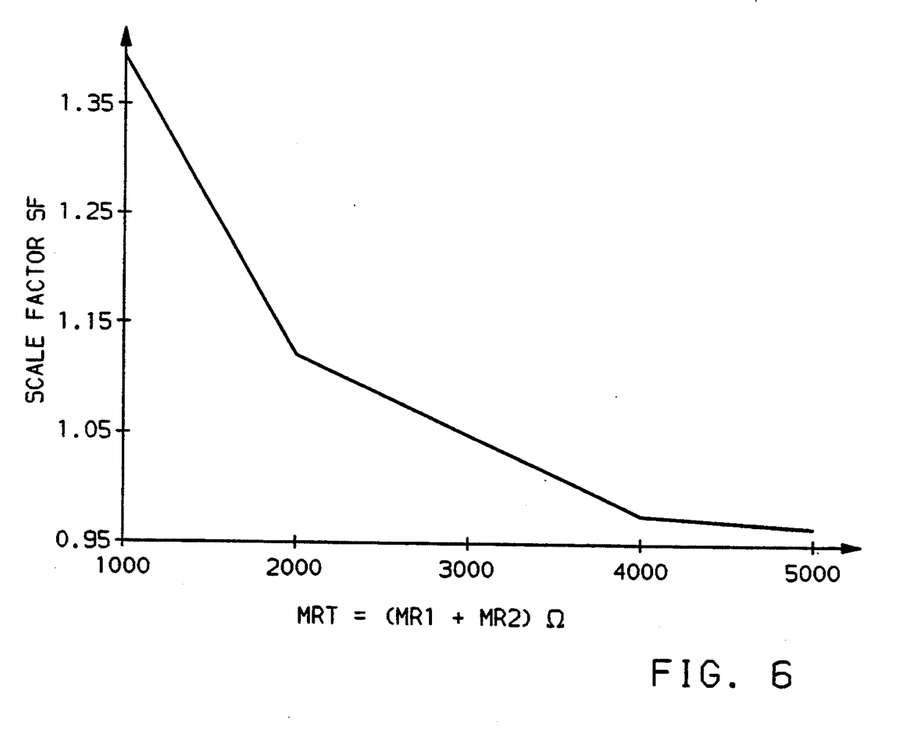
FIG. 6 illustrates a plot of a multiplicative scale factor representing the difference between the slopes of non-room temperature resistance RATIO curves and the slope of the room temperature resistance RATIO curve.

Referring now to FIG. 6, there is shown a plot for a scale factor SF representing the multiplicative difference between the slopes of non-room temperature resistance RATIO curves (about the magnetic center point 40) and the slope of the room temperature or 20° C. resistance RATIO curve (labeled T2 in FIG. 4). Note that the scale factor SF can be determined by the value of the bulk resistance MRT which is inversely related to the operating temperature of the magnetoresistors MR1 and MR2. The scale factor SF is utilized in making slope adjustments in accordance with the following transformation equation:

$$RATIO' = (RATIO - 0.5) * SF + 0.5 \quad (1)$$

where RATIO represents a non-room temperature value for the resistance RATIO for a particular slide bar position, and SF represents the scale factor (for slope adjustment about the magnetic center point 40) determined by the MR operating temperature, or equivalently, the MR bulk or total resistance MRT. RATIO' represents the corresponding transformed value for the resistance RATIO that occurs on the room temperature curve for the same slide bar position (the curve labeled T2 in FIG. 4). The applicants have found that non-room temperature values for the resistance RATIO can be shifted to within 1% of room temperature values for the resistance ratio using the transformation of equation (1) and the scale factor SF values provided in FIG. 6.

To account for sensor mechanical offset, the following correction equation is utilized:

$$RATIO'' = RATIO' + \Delta R, \quad (2)$$

where RATIO' represents the transformed room temperature value for the resistance RATIO provided by equation (1) above, $\Delta R$ represents the electrical offset associated with mechanical offset $\Delta y$ illustrated previously in FIG. 4, and RATIO" represents the offset corrected form of RATIO'.

In practice, the value of the electrical offset is determined by moving the center point 22 of the slide bar 20 to its zero position; determining the corresponding value of RATIO based upon the resulting resistance values of MR1 and MR2; and then computing a value for $\Delta R$ by subtracting the determined value for RATIO from 0.5. It will be recognized that the determined value of the resistance RATIO used for computing $\Delta R$ generally does not have to be transformed to the room temperature value by utilizing equation (1), since the mechanical offset $\Delta y$ is usually so small that the resistance RATIO curves for different operating temperatures do not differ significantly when the slide bar 20 is in its zero position (see FIG. 4).

Figure 7:
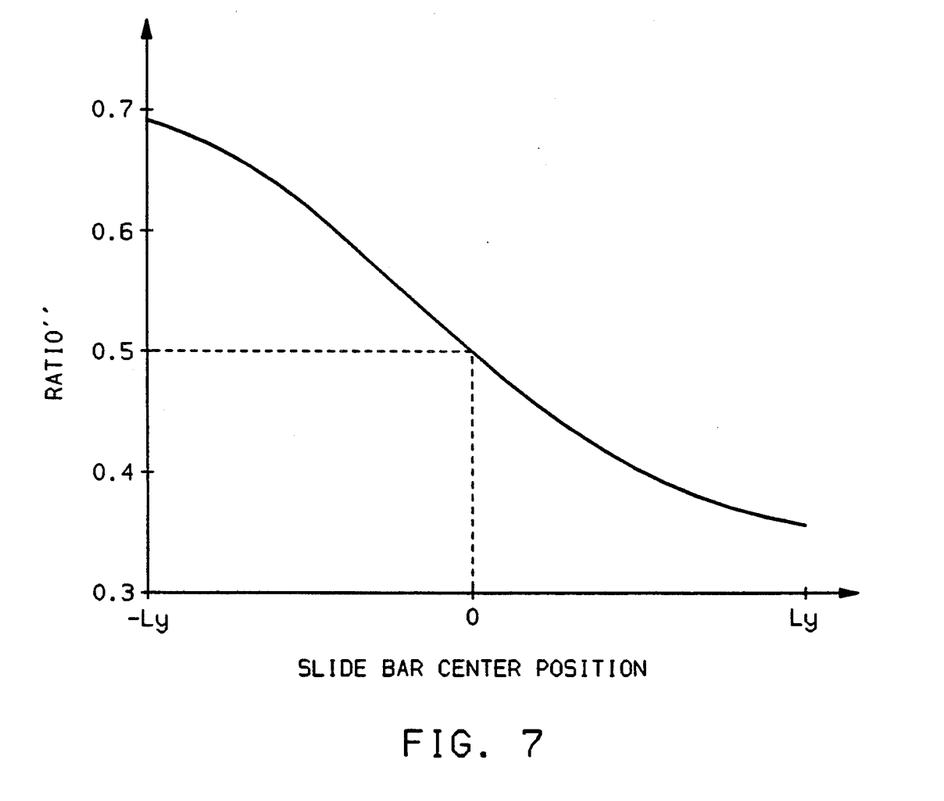
FIG. 7 illustrates a plot of offset corrected values for the resistance RATIO of the magnetoresistive position sensor at room temperature.

Referring now to FIG. 7, there is shown a plot for RATIO", which represents the offset corrected form of the resistance RATIO for the magnetoresistive position sensor 10 at 20° C. (i.e. RATIO', since the curves for RATIO and RATIO' are identical at 20° C. The plot shown in FIG. 7 is obtained by simply translating the curve labeled T2 to the right in FIG. 4 in the direction along the slide bar center position axis until the point where RATIO=0.5 on the curve occurs at the zero slide bar center position.

The present invention utilizes the transformation and correction defined by equations (1) and (2), along with the relationship provided by the curve in FIG. 7 to essentially eliminate the influence of temperature changes and mechanical offset from the accuracy of the slide bar center location measured by the magnetoresistive position sensor 10. This compensation for temperature variation and correction for sensor mechanical offset is carried out in the computer 38 based upon the measured values of the voltages VP, V1, and V2 directed to the computer A/D converter (see FIG. 3).

Figure 8:
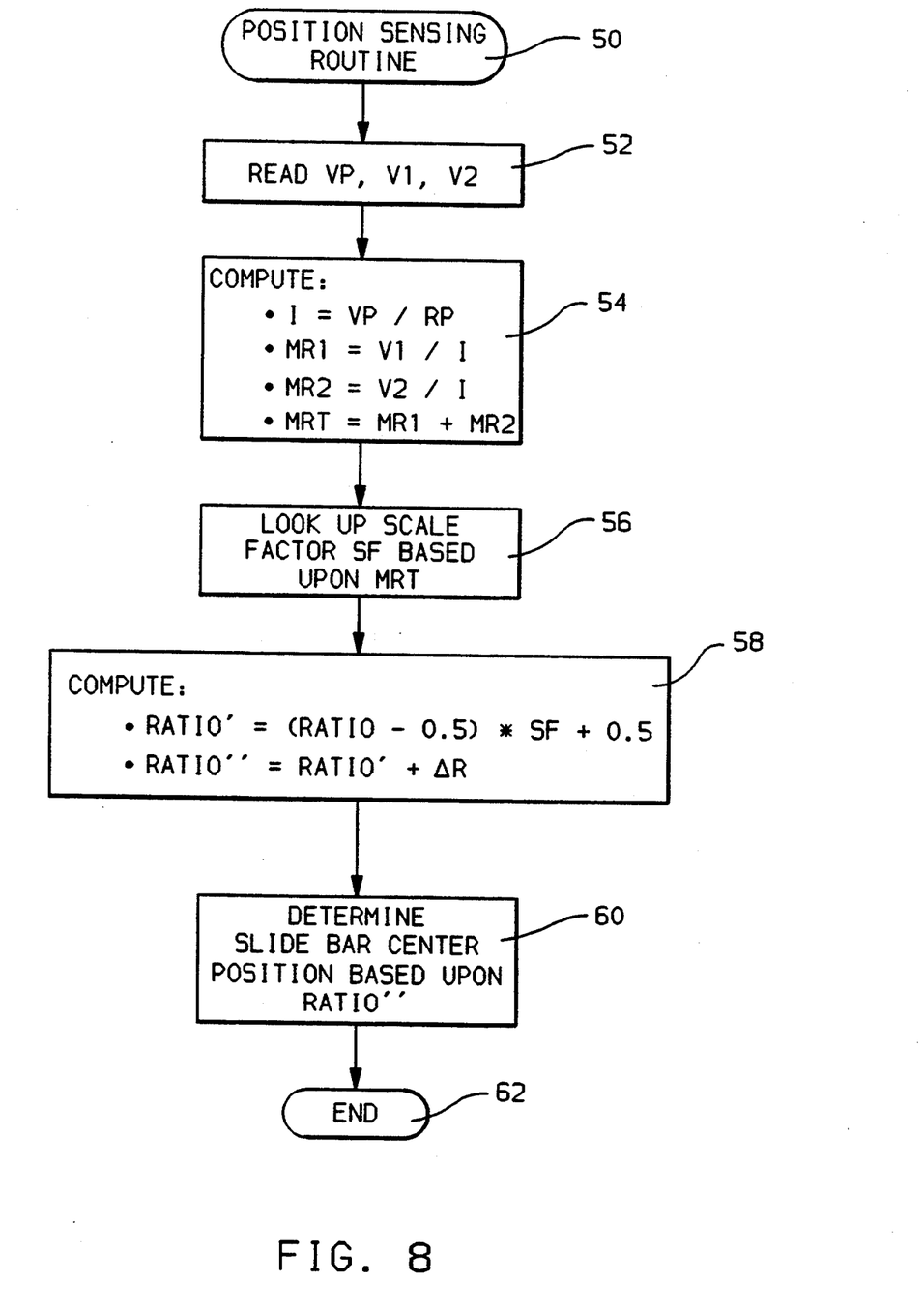
FIG. 8 illustrates a flow diagram representative of the steps carried out when compensating the magnetoresistive position sensor for temperature variations and correcting to account for sensor mechanical offset.

Referring now to FIG. 8, there is shown a flow diagram representative of the steps carried out by computer 38 in compensating the slide bar center location measured by the magnetoresistive position sensor 10. In practice, the POSITION SENSING ROUTINE will normally form one of many subroutines contained within a main monitoring or control program being executed by computer 38.

The POSITION SENSING ROUTINE is entered at point 50 and proceeds to step 52, where sampled values for the voltages VP, V1, and V2 are read from the A/D converter within computer 38.

From step 52, the routine proceeds to step 54 where several computations are performed. A value for the current I is computed by dividing the sampled value for the voltage VP by the known resistance value of the precision resistor RP, typically stored in EEPROM. Values for the resistances of the magnetoresistors are then computed in accordance with MR1=V1/I, and MR2=V2/I, and the bulk resistance for the magnetoresistive position sensor 10 is computed as MRT=MR1+MR2.

Next, the routine proceeds to step 56 where a value for the scale factor SF is looked up in a table stored in EEPROM based upon the value for the bulk resistance determined in the previous step 56. Values for the SF look up table in the present embodiment are derived from the curve presented in FIG. 6.

From step 56, the routine proceeds to step 58 where additional computations are performed. A value for the resistance RATIO' is computed in accordance with equation (1), where in the present embodiment RATIO=MR2/(MR1+MR2), or equivalently, RATIO=MR2/MRT, with the values for SF, MR1, MR2, and MRT provided in steps 54 and 56. Recall that equation (1) transforms a value for the resistance RATIO determined at any sensor operating temperature to a value designated as RATIO', where RATIO' represents the corresponding value that would have been determined for RATIO with the same slide bar location at a sensor operating temperature of 20° C. The value computed for RATIO' is then used to compute a value for RATIO" according to equation (2), which corrects for the sensor mechanical offset. The value for ΔR is typically stored in EEPROM, and is determined as described previously.

From step 58, the routine proceeds to step 60, where a temperature compensated and mechanical offset corrected position for the slide bar 20 is determined based upon the value of RATIO" and the relationship defined by the curve in FIG. 7. This is accomplished in different ways depending upon the defined range of movement of the slide bar 20. If the movement of the slide bar 20 is confined to the relatively linear central portion of the curve in the plot of FIG. 7, then the temperature compensated and offset corrected position for slide bar 20 can be computed from a linear equation fit to the central portion of the curve based upon the value of RATIO". However, if the movement of slide bar 20 extends to non-linear outer portions of the curve in the plot of FIG. 7, then the temperature compensated and offset corrected position for slide bar 20 can be looked up in table of values derived from FIG. 7 and stored in EEPROM.

Once the temperature compensated and offset corrected position for the slide bar center is determined in step 60, the routine is exited at point 62.

Consequently, by accurately transforming the non-room temperature behavior of the resistance RATIO of the magnetoresistive position sensor 10 to within 1% of the corresponding behavior of RATIO at room temperature, i.e. RATIO' values, only the room temperature characteristics of the magnetoresistive position sensor 10 have to be known and accurately represented in order to essentially eliminate the influence of sensor operating temperature on the accuracy of position measurements.

In addition, the present embodiment has the advantage of not requiring that the voltage source 30 be regulated since the resistance values for the magnetoresistive elements are determined in terms of the current I, which itself is determined by the measured voltage drop VP appearing across the known precision resistor RP. As a consequence, the present invention can be implemented in a much simpler fashion with less expensive components that is typically the case with other prior art approaches directed toward temperature compensation for magnetoresistive position sensors.

It will be understood that in the above described routine, a temperature compensated location for the slide bar 20 can be determined in step 60 using the value RATIO' determined at step 58, rather than the value of RATIO". This would be appropriate in applications when the sensor mechanical offset is not significant, and as a result, the value of RATIO" would not have to be computed in step 58.

In the above described embodiment of the invention, the values of the scale factor SF in FIG. 6 were used to transform resistance RATIO values occurring at any sensor operating temperature to corresponding RATIO values at the operating temperature of 20° C. for the same slide bar positions. It will also be understood that values for SF differing from those presented in FIG. 6 could be used to transform the resistance RATIO values to corresponding RATIO values at an operating temperature other than 20° C. Of course that operating temperature would have to form the basis for the relationship used at step 60 between RATIO" and slide bar position rather than the curve labeled T2 (20° C. from FIG. 4.

It will also be understood that the value resistance RATIO in the above description could also be determined by dividing the resistance of MR1 by sum of the resistances of MR1 and MR2. This would result in a reversal of the behavior of the RATIO, RATIO', and RATIO" curves with respect to the plus and minus portions of the slide bar center position axis, but the modifications necessary to use this form of the resistance ratio to provide temperature compensation and offset correction will be readily apparent to those skilled in the art.

Additionally, those skilled in the art will also recognize that the resistance ratios denoted as RATIO, RATIO', and RATIO" used in explaining the present embodiment could alternatively be represented in terms of the voltage drops appearing across the magnetoresistors MR1 and MR2.

The aforementioned description of the preferred embodiments of the invention are for the purpose of illustrating the invention, and are not to be considered as limiting or restricting the invention, since many modifications may be made by the exercise of skill in the art without departing from the scope of the invention.

The embodiments of the invention in which an exclusive property or privilege is claimed are defined as follows:

1. A magnetoresistive position sensor compensated to operate at different temperatures, the sensor comprising:
   a first magnetoresistor element having a first resistance and a second magnetoresistor element having a second resistance, the first and second magnetoresistor elements being electrically connected in series;
   magnetic biasing means for directing magnetic flux through each magnetoresistor element;
   means for electrically exciting the series connected first and second magnetoresistive elements to cause a current to flow therethrough;
   a magnetically permeable member having a defined range of movement relative to the first and second magnetoresistors for varying the magnetic flux passing through each magnetoresistor element and changing the respective resistance thereof, while maintaining a sum of the respective resistances of the first and second magnetoresistor elements at a substantially constant value determined by the sensor operating temperature;
   means for determining the respective resistances of the first and second magnetoresistor elements based upon the current flowing therethrough, and the sum of the respective resistances at the sensor operating temperature;
   means for determining a value for a ratio at the sensor operating temperature with the magnetically permeable member located at a position within the defined range of movement, the ratio being substantially equal to the determined resistance of one of the magnetoresistive elements divided by the determined sum of the respective resistances of the first and second magnetoresistive elements;
   means for transforming the value for the ratio at the sensor operating temperature to a corresponding compensated value for the ratio at a defined temperature based upon the sum of the respective resistances of the first and second magnetoresistors; and means for determining the position of the magnetically permeable member relative to the first and second magnetoresistors in accordance with the compensated value for the ratio at the defined temperature.

2. A magnetoresistive position sensor compensated to operate at different temperatures, the sensor comprising:

a first magnetoresistor element having a first resistance and a second magnetoresistor element having a second resistance, the first and second magnetoresistor elements being electrically connected in series;

magnetic biasing means for directing magnetic flux through each magnetoresistor element;

a voltage source connected in series with a precision resistor and the series connected first and second magnetoresistive elements for causing a current to flow therethrough, the precision resistor having a temperature coefficient of resistance smaller than that of the magnetoresistor elements;

a magnetically permeable member having a defined range of movement relative to the first and second magnetoresistors for varying the magnetic flux passing through each magnetoresistor element and changing the respective resistance thereof, while maintaining a sum of the respective resistances of the first and second magnetoresistor elements at a substantially constant value determined by the sensor operating temperature;

means for determining the resistances of the first magnetoresistor element, the second magnetoresistor element, and the sum of the resistances of the magnetoresistor elements based upon the current flowing therethrough at the sensor operating temperature, the current being determined from a drop in voltage appearing across the precision resistor;

means for determining a value for a resistance ratio at the sensor operating temperature with the magnetically permeable member located at a position within the defined range of movement, the resistance ratio being substantially equal to the determined resistance of one of the magnetoresistive elements divided by the determined sum of the respective resistances of the first and second magnetoresistive elements;

means for transforming the value for the resistance ratio at the sensor operating temperature to a corresponding compensated value for the resistance ratio at a defined temperature based upon the sum of the respective resistances of the first and second magnetoresistors; and means for determining the position of the magnetically permeable member relative to the first and second magnetoresistors in accordance with the compensated value for the resistance ratio at the defined temperature.

3. A magnetoresistive position sensor compensated to operate at different temperatures, the sensor comprising:

a first magnetoresistor element having a first resistance and a second magnetoresistor element having a second resistance, the first and second magnetoresistor elements being electrically connected in series;

magnetic biasing means for directing magnetic flux through each magnetoresistor element;

means for electrically exciting the series connected first and second magnetoresistive elements to cause a current to flow therethrough;

a magnetically permeable member having a defined range of movement relative to the first and second magnetoresistors for varying the magnetic flux passing through each magnetoresistor element and changing the respective resistance thereof, while maintaining a sum of the respective resistances of the first and second magnetoresistor elements at a substantially constant value determined by the sensor operating temperature;

means for determining the respective resistances of the first and second magnetoresistor elements based upon the current flowing therethrough, and the sum of the respective resistances at the sensor operating temperature;

means for determining a value for a resistance ratio at the sensor operating temperature with the magnetically permeable member located at a position within the defined range of movement, the resistance ratio being substantially equal to the determined resistance of one of the magnetoresistive elements divided by the determined sum of the resistances of the first and second magnetoresistive elements;

means for transforming the value for the resistance ratio at the sensor operating temperature to a corresponding compensated value for the resistance ratio at a defined temperature based upon the sum of the resistances of the first and second magnetoresistors;

means for correcting the compensated value for the resistance ratio to obtain a corrected value for the resistance ratio that accounts for a mechanical offset representing an amount by which a defined zero location for the magnetically permeable member differs from a location causing the resistance of the first magnetoresistor element to essentially equal the resistance of the second magnetoresistor element; and means for determining the position of the magnetically permeable member relative to the first and second magnetoresistors in accordance with the corrected value for the resistance ratio.

4. A magnetoresistive position sensor compensated to operate at different temperatures, the sensor comprising:

a first magnetoresistor element having a first resistance MR1 and a second magnetoresistor element having a second resistance MR2, the first and second magnetoresistor elements being electrically connected in series;

magnetic biasing means for directing magnetic flux through each magnetoresistor element;

means for electrically exciting the series connected first and second magnetoresistive elements to cause a current I to flow therethrough;

a magnetically permeable member having a defined range of movement relative to the first and second magnetoresistors for varying the magnetic flux passing through each magnetoresistor element and changing the respective resistance thereof, while maintaining a sum MRT=MR1+MR2 of the respective resistances of the first and second magnetoresistor elements at a substantially constant value determined by the sensor operating temperature;

means for determining the resistances MR1, MR2, and MRT for the first and second magnetoresistor elements based upon the current I flowing therethrough at the sensor operating temperature;

means for determining a value for a resistance ratio designated as RATIO at the sensor operating temperature with the magnetically permeable member located at a position within the defined range of movement, where the value for the resistance ratio is determined in accordance with RATIO=MR2/MRT;

means for determining the value of a scale factor SF based the sum MRT of the resistances of the first and second magnetoresistor elements;

means for transforming the value for RATIO to a compensated value for the resistance ratio at a defined temperature, where the compensated value is designated as RATIO' and is determined in accordance with the transformation defined by RATIO'=(RATIO −0.5)*SF+0.5;

means for determining the position of the magnetically permeable member relative to the first and second magnetoresistors in accordance with the compensated value RATIO'.

5. A magnetoresistive position sensor compensated to operate at different temperatures, the sensor comprising:

a first magnetoresistor element having a first resistance MR1 and a second magnetoresistor element having a second resistance MR2, the first and second magnetoresistor elements being electrically connected in series;

magnetic biasing means for directing magnetic flux through each magnetoresistor element;

means for electrically exciting the series connected first and second magnetoresistive elements to cause a current I to flow therethrough;

a magnetically permeable member having a defined range of movement relative to the first and second magnetoresistors for varying the magnetic flux passing through each magnetoresistor element and changing the respective resistance thereof, while maintaining a sum MRT=MR1+MR2 of the respective resistances of the first and second magnetoresistor elements at a substantially constant value determined by the sensor operating temperature;

means for determining the resistances MR1, MR2, and MRT for the first and second magnetoresistor elements based upon the current I flowing therethrough at the sensor operating temperature;

means for determining a value for a resistance ratio designated as RATIO at the sensor operating temperature with the magnetically permeable member located at a position within the defined range of movement, where the value of the resistance ratio is determine in accordance with RATIO=MR2/MRT;

means for determining the value of a scale factor SF based upon the sum MRT of the resistances of the first and second magnetoresistor elements;

means for transforming the value for RATIO to a compensated value for the resistance ratio at a defined temperature, where the compensated value is designated as RATIO' and is determined in accordance with the transformation defined by RATIO' a defined temperature, where the compensated value for RATIO'=(RATIO −0.5)*SF+0.5;

means for correcting the compensated value for RATIO' to obtain a corrected value designated as RATIO" that accounts for a mechanical offset representing an amount by which a defined zero location for the magnetically permeable member differs from a location causing the resistance MR1 of the first magnetoresistor element to essentially equal the resistance MR2 of the second magnetoresistor element; and means for determining the position of the magnetically permeable-member relative to the first and second magnetoresistors in accordance with the corrected value for RATIO".

6. The magnetoresistive position sensor as described in claim 5, wherein the corrected value for RATIO" is determined by adding a term ΔR to the compensated value for RATIO", where ΔR is calculated by subtracting a value for RATIO determined at the sensor operating temperature with the magnetically permeable member located at the defined zero position from a value of 0.5.

* * * * *